United States Patent
Kang et al.

(10) Patent No.: US 7,741,668 B2
(45) Date of Patent: Jun. 22, 2010

(54) NONVOLATILE FERROELECTRIC MEMORY DEVICE

(75) Inventors: Hee Bok Kang, Daejeongwangyeok-si (KR); Jin Hong Ahn, Gyeonggi-do (KR); Jae Jin Lee, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 14 days.

(21) Appl. No.: 11/717,081

(22) Filed: Mar. 13, 2007

(65) Prior Publication Data

US 2007/0170480 A1 Jul. 26, 2007

Related U.S. Application Data

(62) Division of application No. 11/115,131, filed on Apr. 27, 2005, now abandoned.

(30) Foreign Application Priority Data

Dec. 29, 2004 (KR) ................ 10-2004-0115418
Dec. 29, 2004 (KR) ................ 10-2004-0115419

(51) Int. Cl.
*H01L 29/94* (2006.01)
(52) U.S. Cl. .................. 257/295; 257/E27.104
(58) Field of Classification Search .......... 257/295, 257/E27.104
See application file for complete search history.

(56) References Cited

U.S. PATENT DOCUMENTS

| | | | |
|---|---|---|---|
| 5,723,885 A * | 3/1998 | Ooishi | .......... 257/295 |
| 5,751,037 A | 5/1998 | Aozasa et al. | |
| 6,151,241 A | 11/2000 | Hayashi et al. | |
| 6,222,756 B1 | 4/2001 | Lee | |
| 6,532,165 B1 | 3/2003 | Katori | |

(Continued)

FOREIGN PATENT DOCUMENTS

JP 08-335645 12/1996

(Continued)

OTHER PUBLICATIONS

Kang et al., "A Dual-Gate Cell (DGC) FeRAM With NDRO and Random Access Scheme for Nanoscale and Terabit Non-Volatile Memory," *Integrated Ferroelectrics* 81:141-148 (2006).

(Continued)

*Primary Examiner*—Cuong Q Nguyen
*Assistant Examiner*—Trang Q Tran
(74) *Attorney, Agent, or Firm*—Townsend and Townsend and Crew LLP

(57) ABSTRACT

A nonvolatile ferroelectric memory device is provided so as to control read/write operations of a nonvolatile memory cell using a channel resistance of the memory cell which is differentiated by polarity states of a ferroelectric material. In the memory device, an insulating layer is formed on a bottom word line, and a floating channel layer comprising a N-type drain region, a P-type channel region and a N-type source region is formed on the insulating layer. Then, a ferroelectric layer is formed on the floating channel layer, and a word line is formed on the ferroelectric layer. As a result, the resistance state induced to the channel region is controlled depending on the polarity of the ferroelectric layer, thereby regulating the read/write operations of the memory cell array.

4 Claims, 15 Drawing Sheets

U.S. PATENT DOCUMENTS

| | | |
|---|---|---|
| 6,614,066 B2 | 9/2003 | Stengl et al. |
| 6,777,255 B2 | 8/2004 | Yamazaki |
| 6,784,473 B2 | 8/2004 | Sakai et al. |
| 6,787,832 B2 | 9/2004 | Schmid et al. |
| 2002/0054522 A1 | 5/2002 | Inoue et al. |
| 2003/0223292 A1 | 12/2003 | Nejad et al. |

FOREIGN PATENT DOCUMENTS

| | | |
|---|---|---|
| JP | 09-097851 | 4/1997 |
| JP | 10-303378 | 11/1998 |
| JP | 11-274423 | 10/1999 |
| JP | 2001-110192 | 4/2001 |
| KR | 1020030024223 A | 3/2003 |

OTHER PUBLICATIONS

Christer Svensson, Forty Years of Feature-Size Predictions, IEEE International Solid-State Circuits Conference, 2003, Digest of Technical Papers, S.35-36, 28-29; Sp. 2,3.Abs.

* cited by examiner

US 7,741,668 B2

NONVOLATILE FERROELECTRIC MEMORY DEVICE

CORRESPONDING RELATED APPLICATION

This application is a Divisional of U.S. application patent Ser. No. 11/115,131 filed Apr. 27, 2005, which claims priority to Korean Patent Application No. 10-2004-0115418 filed Dec. 29, 2004, and Korean Patent Application No. 10-2004-0115419 filed Dec. 29, 2004, which are hereby incorporated by reference in their entirety.

BACKGROUND OF THE INVENTION

1. Field of the Invention

The present invention generally relates to a nonvolatile ferroelectric memory device, and more specifically, to a technology of controlling read/write operations of a nonvolatile ferroelectric memory cell using a channel resistance of a memory cell which is differentiated by polarity states of a ferroelectric material in a nano scale memory device.

2. Description of the Related Art

Generally, a ferroelectric random access memory (hereinafter, referred to as 'FeRAM') has attracted considerable attention as next generation memory device because it has a data processing speed as fast as a Dynamic Random Access Memory (hereinafter, referred to as 'DRAM') and conserves data even after the power is turned off.

The FeRAM having structures similar to the DRAM includes the capacitors made of a ferroelectric substance, so that it utilizes the characteristic of a high residual polarization of the ferroelectric substance in which data is not deleted even after an electric field is eliminated.

The technical contents on the above FeRAM are disclosed in the Korean Patent Application No. 2001-57275 by the same inventor of the present invention. Therefore, the basic structure and the operation on the FeRAM are not described herein.

A unit cell of a conventional nonvolatile FeRAM device comprises a switching element and a nonvolatile ferroelectric capacitor. The switching element performs a switching operation depending on a state of a word line to connect a nonvolatile ferroelectric capacitor to a sub bit line. The nonvolatile ferroelectric capacitor is connected between and a plate line and one terminal of the switching element.

Here, the switching element of the conventional FeRAM is a NMOS transistor whose switching operation is controlled by a gate control signal.

FIG. 1 is a cross-sectional diagram illustrating a conventional nonvolatile ferroelectric memory device.

A conventional 1-T (One-Transistor) FET (Field Effect Transistor) cell comprises a N-type drain region 2 and a N-type source region 3 which are formed on a P-type region substrate 1. A ferroelectric layer 4 is formed on a channel region, and a word line 5 is formed on the ferroelectric layer 4.

The above-described conventional nonvolatile FeRAM device reads and writes data by using a channel resistance of the memory cell which is differentiated depending on polarization states of the ferroelectric layer 4. That is, when the polarity of the ferroelectric layer 4 induces positive charges to the channel, the memory cell becomes at a high resistance state to be turned off. On the contrary, when the polarity of the ferroelectric layer 4 induces negative charges to the channel, the memory cell becomes at a low resistance state to be turned on.

However, in the conventional nonvolatile FeRAM device, when the cell size becomes smaller, a data maintaining characteristic is degraded, so that it is difficult to perform the normal operation of the cell. That is, a voltage is applied to an adjacent cell at read/write modes to destroy data of unselected cells, so that interface noise is generated between the cells and it is difficult to perform a random access operation.

SUMMARY OF THE INVENTION

Accordingly, it is an object of the present invention to form a floating channel layer comprising a N-type drain region, a P-type channel region and N-type source region between a word line and a bottom word line, thereby improving a data maintaining characteristic.

It is another object of the present invention to provide the above-described memory cell so as to control read/write operations of a memory cell array, thereby improving reliability of the cell and reducing the whole size of the cell at the same time.

In an embodiment, a nonvolatile ferroelectric memory device comprising a unit cell array which includes a bottom word line, a plurality of insulating layers, a floating channel layer, a plurality of ferroelectric layers, and a plurality of word lines. The plurality of insulating layers is formed on the bottom word line, respectively. The floating channel layer comprises a plurality of P-type channel regions located on the plurality of insulating layers and a plurality of Ntype drain and source regions which are alternately connected in series to the plurality of P-type channel regions. The plurality of ferroelectric layers is formed respectively on the plurality of P-type channel regions of the floating channel layer. The plurality of word lines is formed on the plurality of ferroelectric layers, respectively. Here, the unit cell array reads and writes a plurality of data by inducing different channel resistance to the plurality of P-type channel regions depending on polarity states of the plurality of ferroelectric layers.

In still another embodiment, a nonvolatile ferroelectric memory device comprises a plurality of bit lines arranged in a row direction, a plurality of sensing lines arranged perpendicular to the plurality of bit lines, a plurality of memory cells arranged in row and column directions where the plurality of bit lines and the plurality of sensing lines are crossed, and a plurality of sense amplifiers connected one by one to the plurality of bit lines. Here, each of the plurality of memory cells comprises an insulating layer formed on a bottom word line, the floating channel layer comprising a P-type channel region formed on the floating layer and kept at a floating state, a N-type drain region and a N-type source region which are connected to both sides of the channel region, a ferroelectric layer formed on the channel region of the floating channel layer, and a word line formed on the ferroelectric layer.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
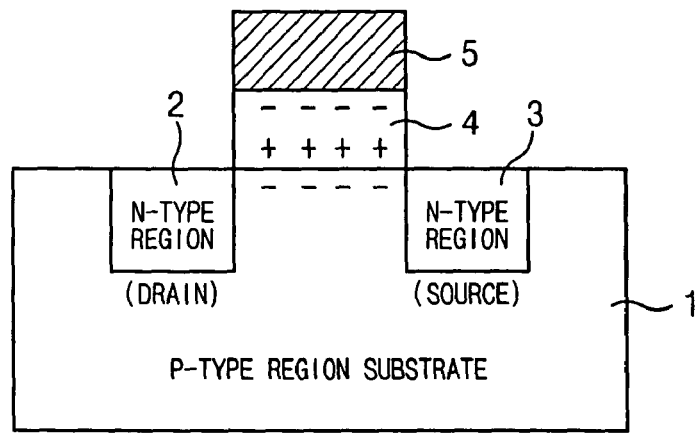
FIG. 1 is a cross-sectional diagram illustrating a conventional nonvolatile ferroelectric memory device.
Figure 2A:
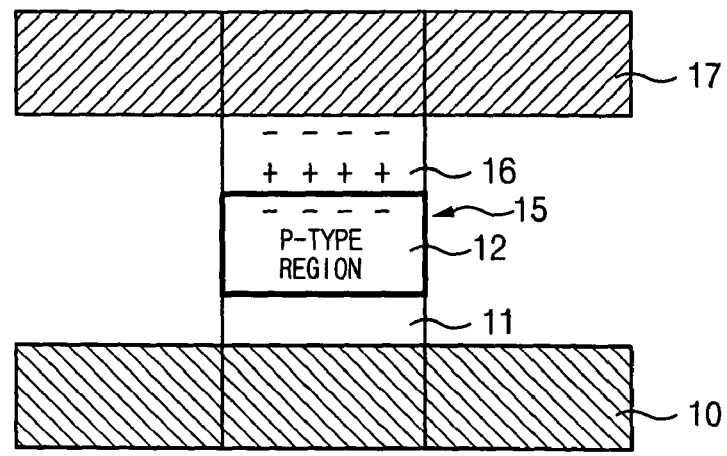
FIGS. 2a to 2c are diagrams illustrating a cross section of a cell and its symbol of a nonvolatile ferroelectric memory device according to an embodiment of the present invention.
Figure 2B:
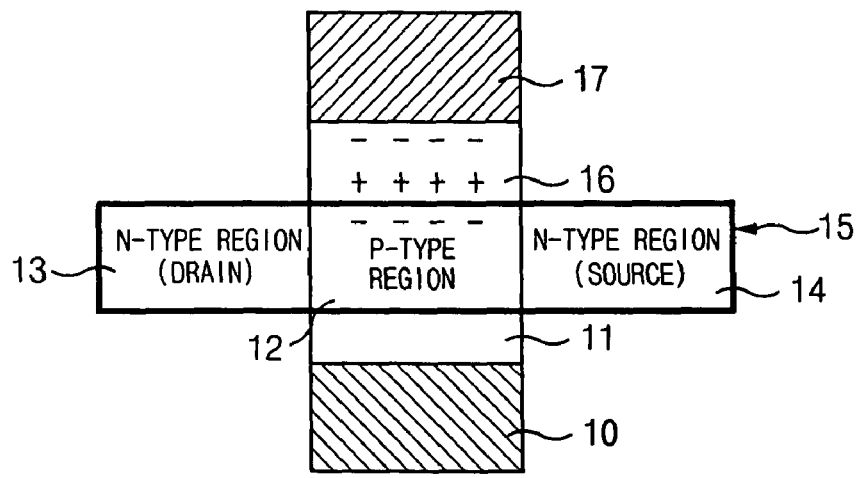
Figure 2C:
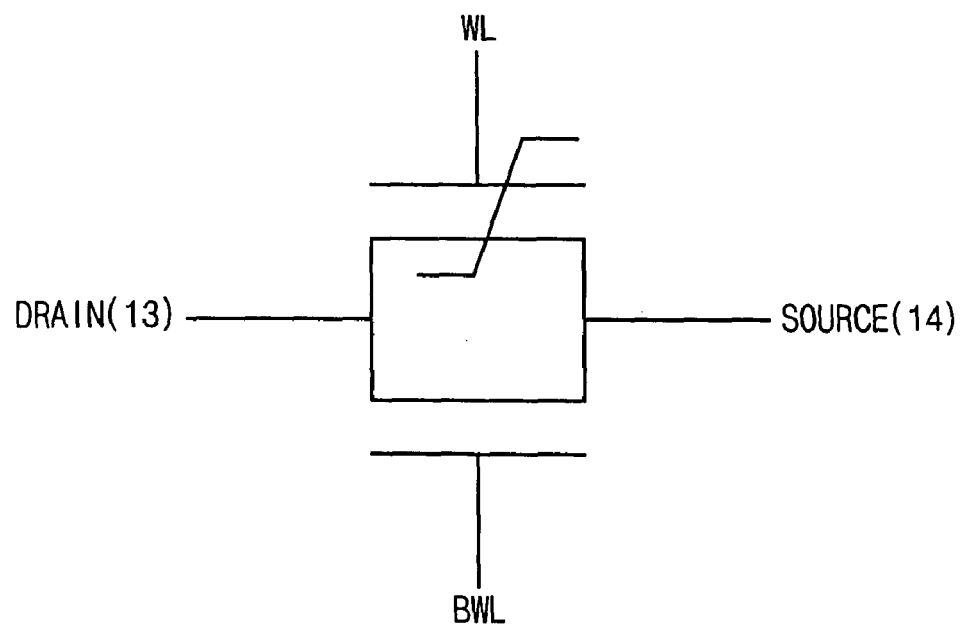

FIGS. 2a to 2c are diagrams illustrating a cross section of a cell and its symbol of a nonvolatile ferroelectric memory device according to an embodiment of the present invention.

FIG. 2a is a cross-sectional diagram illustrating a unit cell in a direction in parallel with a word line.

A bottom word line 10 formed in the bottom layer of the unit cell is arranged in parallel with a word line 17 formed in the top layer of the unit cell. Here, the bottom word line 10 and the word line 17 are selectively driven by the same row address decoder (not shown). An oxide layer 11 is formed on the bottom word line 10, and a floating channel layer 15 comprising a P-type channel region 12 is formed on the oxide layer 11.

A ferroelectric layer 16 is formed on the floating channel layer 15, and the word line 17 is formed on the ferroelectric layer 16.

FIG. 2b is a cross-sectional diagram illustrating a unit cell in a direction perpendicular to the word line.

The oxide layer 11 is formed on the bottom word line 10. The floating channel layer 15 is formed on the insulating layer 11. Here, a drain region 13 and a source region 14 are formed with a N-type, and the channel region 12 is formed with a P-type in the floating channel layer 15, which becomes at a floating state.

For a semiconductor of the floating channel layer 15, materials such as a carbon nano tube, silicon and Ge(Germanium) can be used. The ferroelectric layer 16 is formed on the P-type channel region 12 of the floating channel layer 15, and the word line 17 is formed on the ferroelectric layer 16.

As a result, the nonvolatile ferroelectric memory device according to an embodiment of the present invention reads and writes data by using a channel resistance of the floating channel layer 15 which is differentiated by polarization states of the ferroelectric layer 16. That is, when the polarity of the ferroelectric layer 16 induces positive charges to the channel region 12, the memory cell becomes at a high resistance state, so that the channel is turned off. On the contrary, when the polarity of the ferroelectric layer 16 induces negative charges to the channel region 12, the memory cell becomes at a low resistance state, so that the channel is turned on.

The above-described unit memory cell according to the embodiment of the present invention is represented by a symbol shown in FIG. 2c.

Figure 3A:
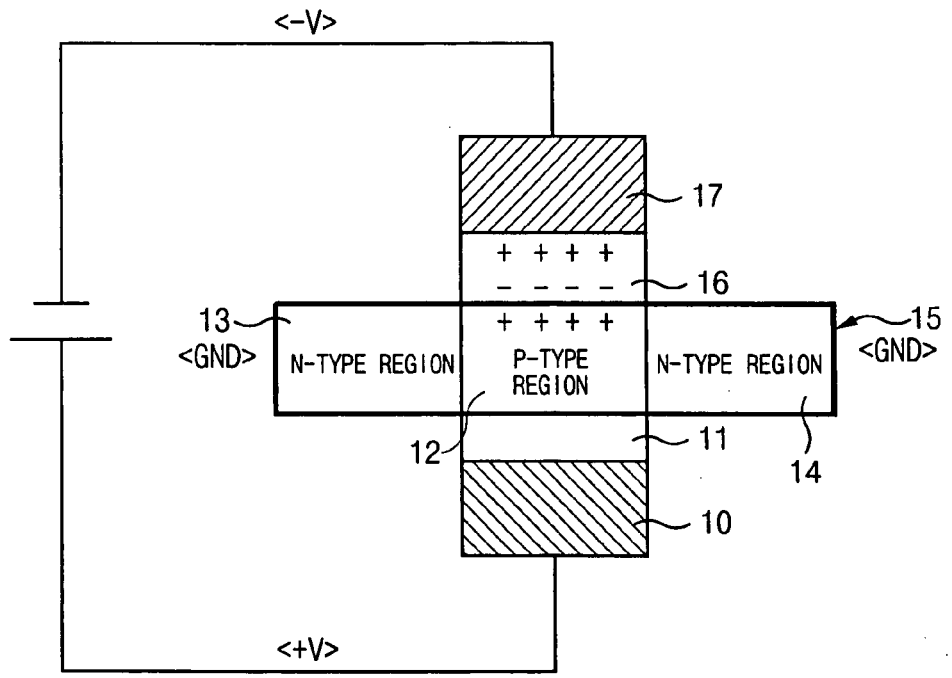
FIGS. 3a and 3b are diagrams illustrating write and read operations on high data of the nonvolatile ferroelectric memory device according to an embodiment of the present invention.
Figure 3B:
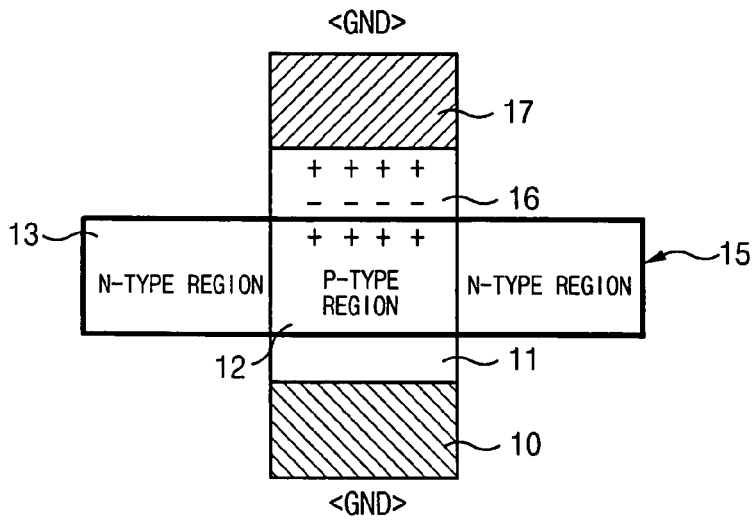

FIGS. 3a and 3b are diagrams illustrating write and read operations on high data of the nonvolatile ferroelectric memory device according to an embodiment of the present invention.

Referring to FIG. 3a, when data "1" is written, a positive voltage <+V> is applied to the bottom word line 10, and a negative voltage <-V> is applied to the word line 17. Here, the drain region 13 and the source region 14 are become at a ground voltage <GND> state.

In this case, a voltage is applied between the ferroelectric layer 16 and the P-type channel region 12 of the floating channel layer 15 by voltage division of a capacitor between the ferroelectric layer 16 and the oxide layer 11.

Then, positive charges are induced to the channel region 12 depending on the polarity of the ferroelectric layer 16, so that the memory cell becomes at the high resistance state. Here, since the positive charges are induced to the channel region 12, and the drain region 13 and the source region 14 are at the ground state, the channel region 12 is kept off. As a result, the data "1" is written in all memory cells at the write mode.

Referring to FIG. 3b, when the data "1" is read, the ground voltage <GND> is applied to the bottom word line 10 and the word line 17. Here, since the positive charges are induced to the channel region 12, and the drain region 13 and the source region 14 are at the ground state, the channel region 12 is kept off.

As a result, at the read mode, the data "1" stored in the memory cell is read. Here, when a low voltage difference is applied to the drain region 13 and the source region 14, small current flows because the channel region 12 is turned off.

Figure 4A:
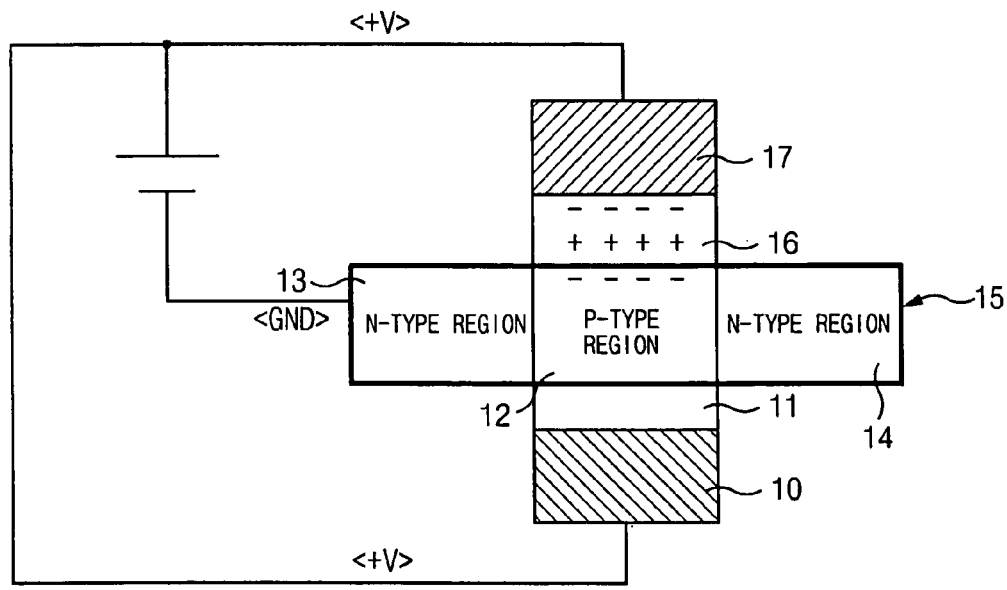
FIGS. 4a and 4b are diagrams illustrating write and read operation on low data of the nonvolatile ferroelectric memory device according to an embodiment of the present invention.
Figure 4B:
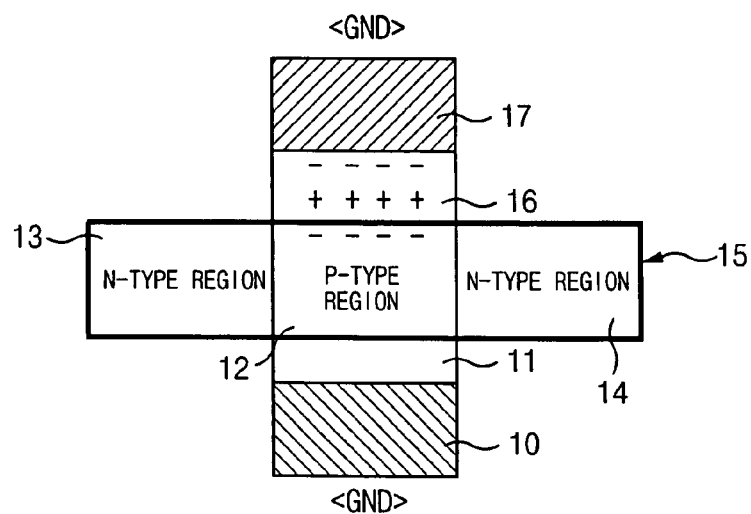

FIGS. 4a and 4b are diagrams illustrating write and read operation on low data of the nonvolatile ferroelectric memory device according to an embodiment of the present invention.

Referring to FIG. 4a, when data "0" is written, a positive voltage <+V> is applied to the bottom word line 10 and the word line 17. Here, the drain region 13 and the source region 14 are become at a ground voltage <GND> state.

In this case, since negative charges are induced to the channel region 12, and the drain region 13 and the source region 14 are at the ground state, the channel region 12 is kept on. As a result, the channel region 12 is turned on, so that a ground voltage flows.

A high voltage is formed between the ground voltage formed in the channel region 12 and the positive voltage <+V> applied from the word line 17. Then, negative charges are induced to the channel region 12 depending on the polarity of the ferroelectric layer 16, so that the memory cell becomes at a low resistance state. As a result, the data "0" is written in the memory cell at the write mode.

Meanwhile, while the data "1" is stored, the positive voltage <+V> is applied to the drain region 13 and the source region 14. When the positive voltage <+V> is applied to the bottom word line 10 and the word line 17, the channel region 12 is turned off. As a result, the ground voltage cannot flow in the channel region 12.

In this case, a voltage difference is not generated between the positive voltage of the channel region 12 at the floating state and the positive voltage <+V> of the word line 17. Thus, the polarity change of the ferroelectric layer 16 is not generated but the previous polarity state can be maintained. As a result, the data "0" is written in the cell selected after the data "1" is written.

Referring to FIG. 4b, when the data "0" is read, the ground voltage <GND> is applied to the bottom word line 10 and the word line 17. Here, since the channel region 12 is turned on even when a low voltage difference is applied between the drain region 13 and the source region 14, a large amount of current can flow. As a result, the data "0" stored in the memory cell is read at the read mode.

Therefore, at the read mode, the data maintaining characteristic of the cell can be improved because the word line 17 and the bottom word line 10 are controlled at the ground level so that a voltage stress is not applied to the ferroelectric layer 16.

Figure 5:
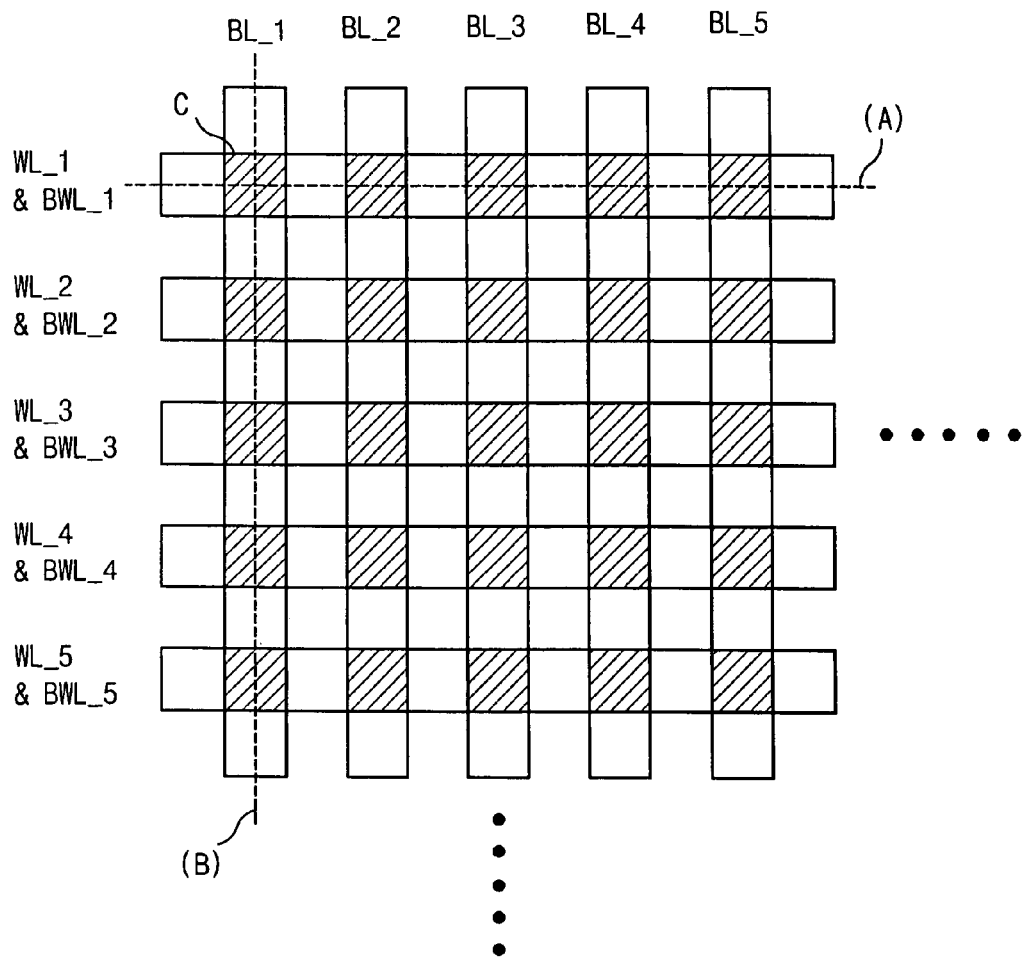
FIG. 5 is a layout cross-sectional diagram illustrating the nonvolatile ferroelectric memory device according to an embodiment of the present invention.

FIG. 5 is a layout cross-sectional diagram illustrating the nonvolatile ferroelectric memory device according to an embodiment of the present invention.

In the embodiment, a plurality of word lines WL are arranged in parallel with a plurality of bottom word lines BWL in a column direction. A plurality of bit lines BL are arranged perpendicular to the plurality of word lines WL. Also, a plurality of unit cells C are located where the plurality of word lines WL, the plurality of bottom word lines BWL and the plurality of bit lines BL are crossed.

Figure 6A:
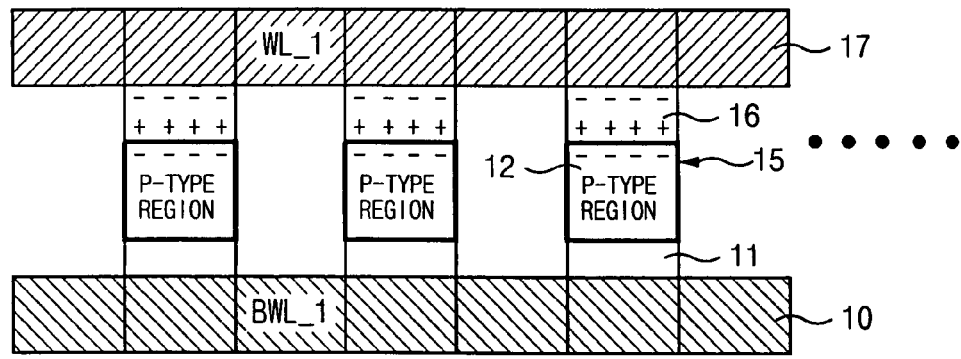
FIGS. 6a and 6b are cross sectional diagrams illustrating the nonvolatile ferroelectric memory device according to an embodiment of the present invention.
Figure 6B:
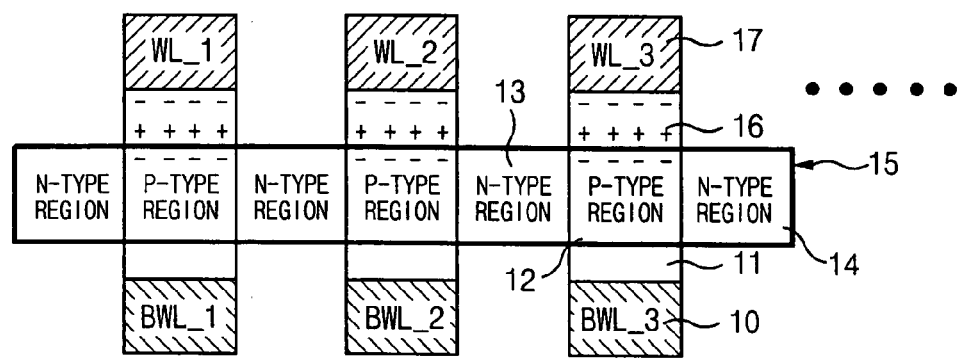

FIGS. 6a and 6b are cross sectional diagrams illustrating the nonvolatile ferroelectric memory device according to an embodiment of the present invention.

FIG. 6a is a diagram illustrating a cross section of the cell array in a direction (A) in parallel with the word line WL of FIG. 5.

In the cell array according to the embodiment of the present invention, a plurality of oxide layers 11 are formed on the bottom word line 10, and a plurality of P-type channel regions 12 are formed on the plurality of oxide layers 11. A plurality of ferroelectric layers 16 are formed on the plurality of channel regions 12, and the word line 17 is formed in parallel with the bottom word line 10 on the plurality of ferroelectric layers 16. As a result, a plurality of cells are connected between one word line WL_1 and one bottom word line BWL_1.

FIG. 6b is a diagram illustrating a cross section of the cell array in a direction (B) perpendicular to the word line WL of FIG. 5.

In the cell array according to the embodiment of the present invention, the oxide layer 11 is formed on each bottom word line BWL_1, BWL_2 and BWL_3. The floating channel layer 15 comprising the N-type drain region 13, the P-type channel region 12 and the N-type source region 14 connected serially is formed on the oxide layer 11.

Here, the N-type drain region 13 can be used as a source region in the adjacent cell, and the N-type source region 14 can be used as a drain region in the adjacent cell. That is, the N-type region is used in common as a drain region and a source region in the adjacent cell.

The ferroelectric layer 16 is formed on each channel region 12 of the floating channel layer 15, and the word lines WL_1, WL_2 and WL_3 are formed on the ferroelectric layer 16.

Figure 7:
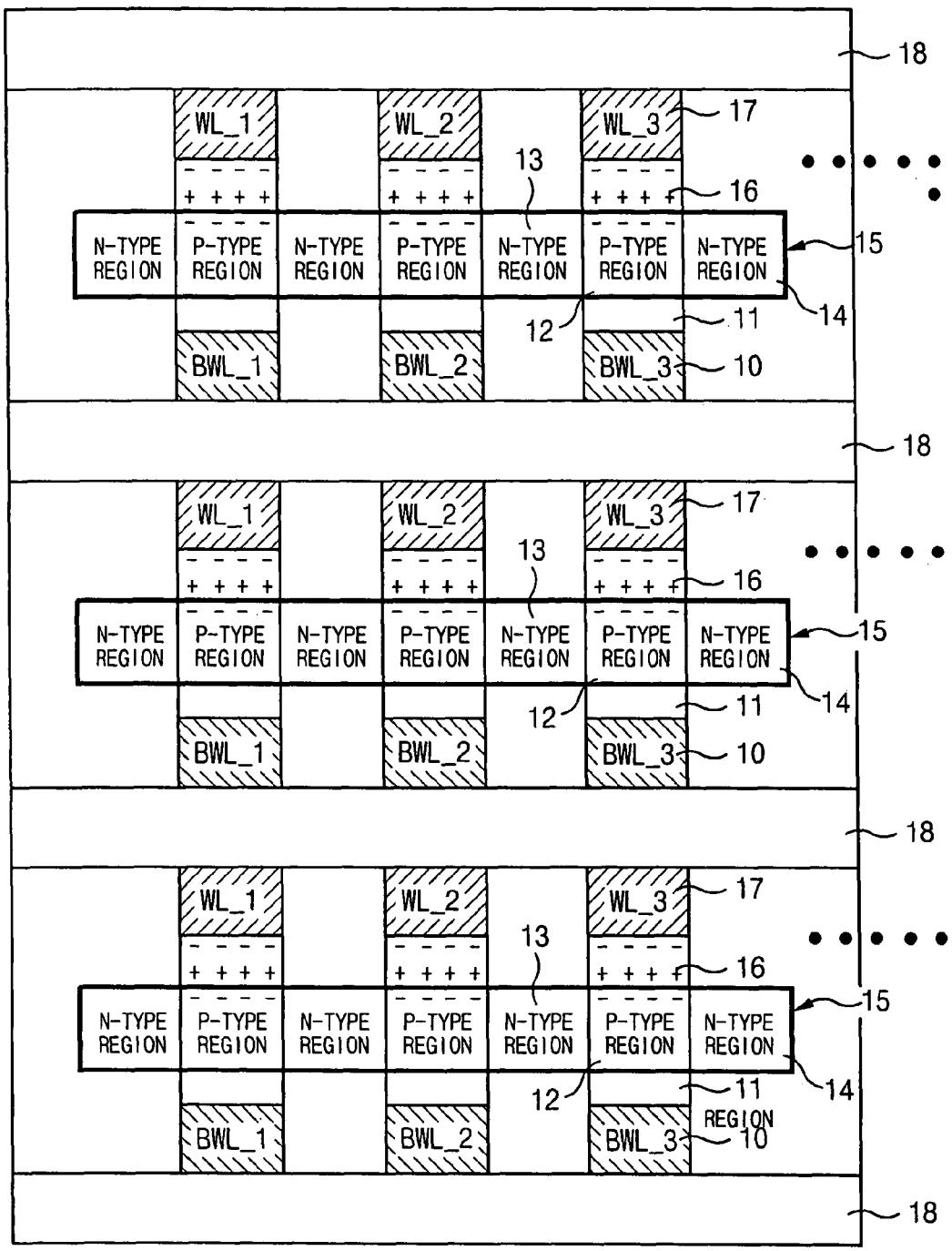
FIG. 7 is a cross-sectional diagram illustrating a nonvolatile ferroelectric memory device having a multiple layer structure according to an embodiment of the present invention.

FIG. 7 is a cross-sectional diagram illustrating a nonvolatile ferroelectric memory device having a multiple layer structure according to an embodiment of the present invention.

Referring to FIG. 7, the unit cell array shown in FIG. 6b is deposited as a multiple layer structure. Each unit cell array is separated by the oxide layer 18.

Figure 8:
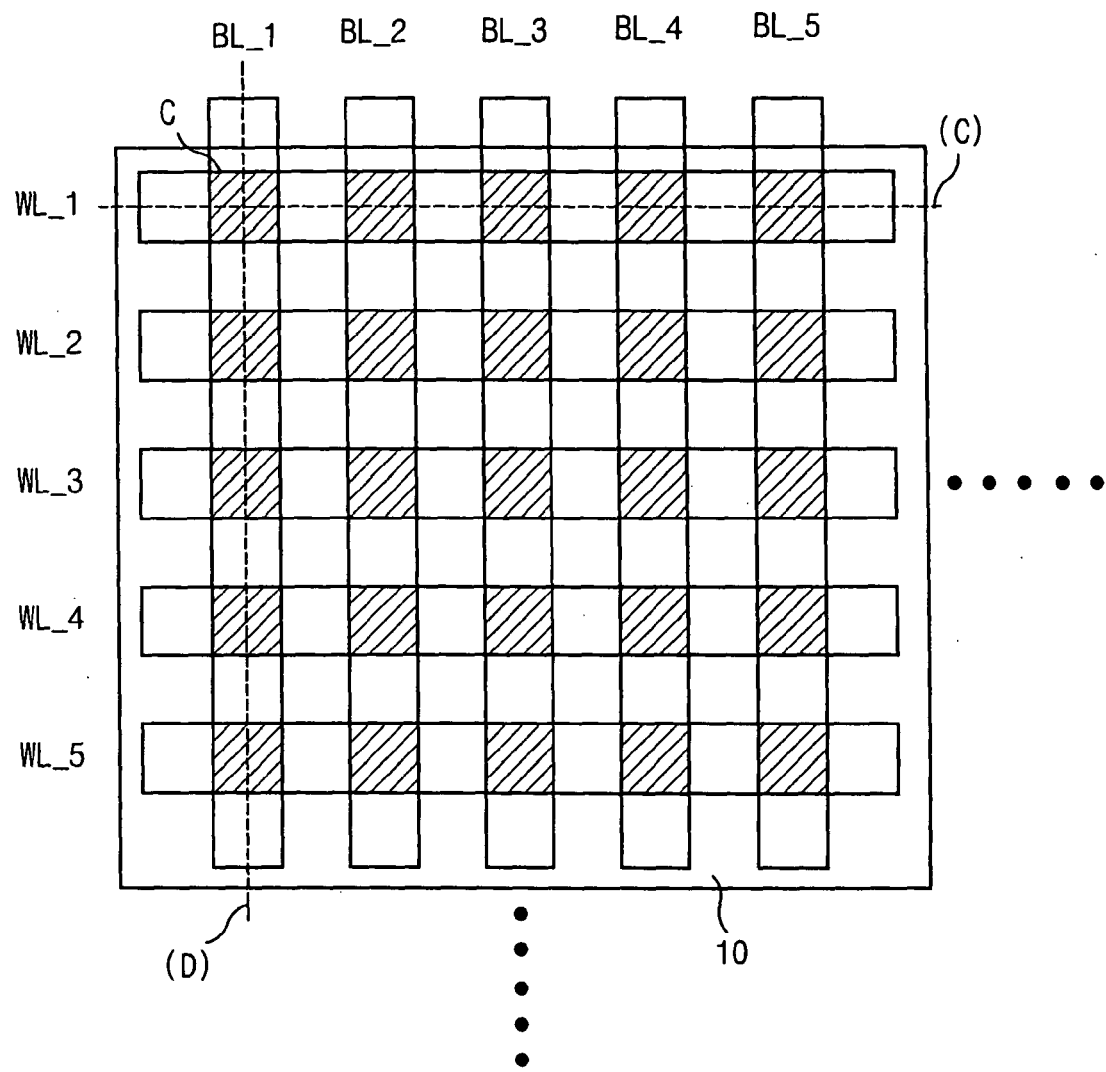
FIG. 8 is a diagram illustrating a nonvolatile ferroelectric memory device according to an embodiment of the present invention.

FIG. 8 is a diagram illustrating a nonvolatile ferroelectric memory device according to another embodiment of the present invention.

In another embodiment, the bottom word line 10 is used in common in a predetermined cell array. A plurality of word lines WL are arranged in a column direction, and a plurality of bit lines BL are arranged in a row direction. A plurality of unit cells C are located where the plurality of word lines WL and the plurality of BL are crossed.

Figure 9A:
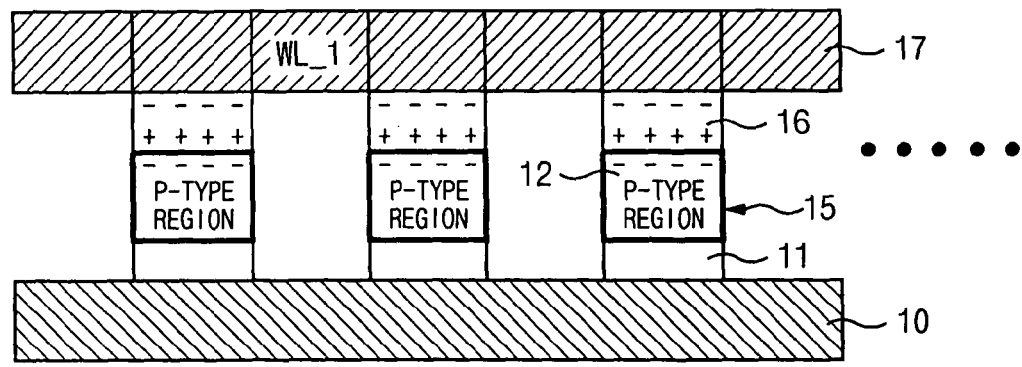
FIGS. 9a and 9b are cross-sectional diagrams illustrating the nonvolatile ferroelectric memory device of FIG. 8.
Figure 9B:
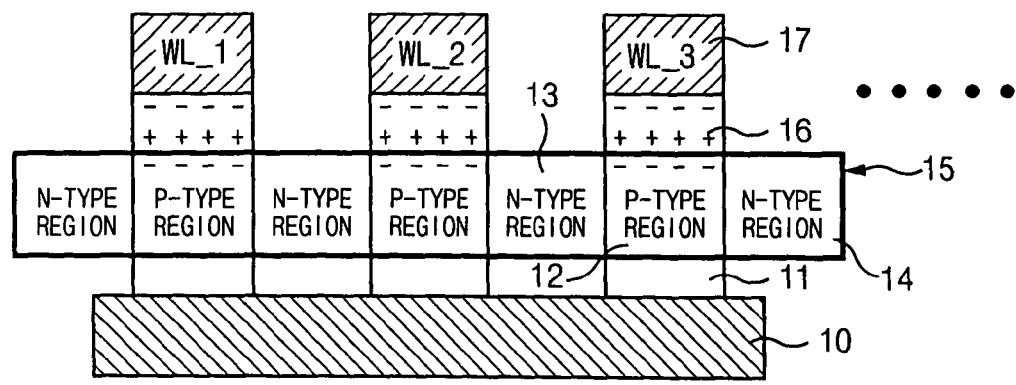

FIGS. 9a and 9b are cross-sectional diagrams illustrating the nonvolatile ferroelectric memory device of FIG. 8.

FIG. 9a is a diagram illustrating a cross section of a cell array in a direction (C) in parallel with the word line WL of FIG. 8.

In the cell array according to the embodiment of the present invention, a plurality of oxide layers 11 are formed on the bottom word line 10, and a plurality of P-type channel regions 12 are formed on the plurality of insulating layers 11. A plurality of ferroelectric layers 16 are formed on the plurality of channel regions 12, and the word line 17 is formed in parallel with the bottom word line 10 on the plurality of ferroelectric layers 16. Thus, a plurality of cells are connected between one word line WL_1 and one bottom word line BWL_1.

FIG. 9b is a diagram illustrating a cross section of a cell array in a direction (D) perpendicular to the word line WL of FIG. 8.

In the cell array according to the embodiment of the present invention, the oxide layer 11 is formed on the bottom word lines BWL_1, BWL_2 and BWL_3 connected in common. The floating channel layer 15 comprising the N-type drain region 13, the P-type channel region 12 and the N-type source region 14 is formed on the oxide layer 11. The ferroelectric layer 16 is formed on each channel region 12 of the floating channel layer 15, and the word lines WL_1, WL_2 and WL_3 are formed on the ferroelectric layer 16.

Figure 10:
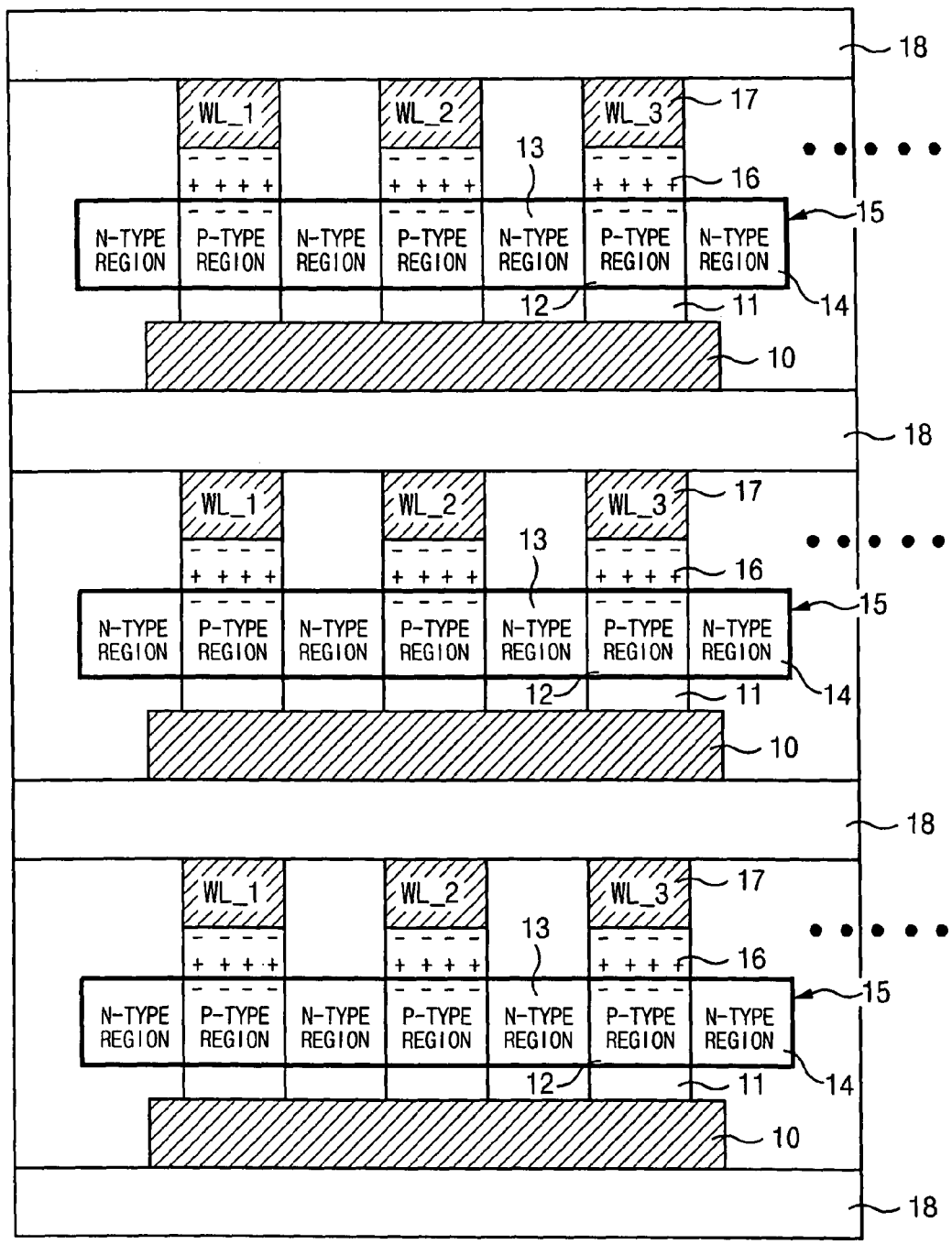
FIG. 10 is a cross-sectional diagram illustrating a nonvolatile ferroelectric memory device having a multiple layer structure of FIG. 8.

FIG. 10 is a cross-sectional diagram illustrating a nonvolatile ferroelectric memory device having a multiple layer structure of FIG. 8.

Referring to FIG. 10, the unit cell array shown in FIG. 9b is deposited as a multiple layer structure. Each unit cell array is separated by the oxide layer 18.

Figure 11:
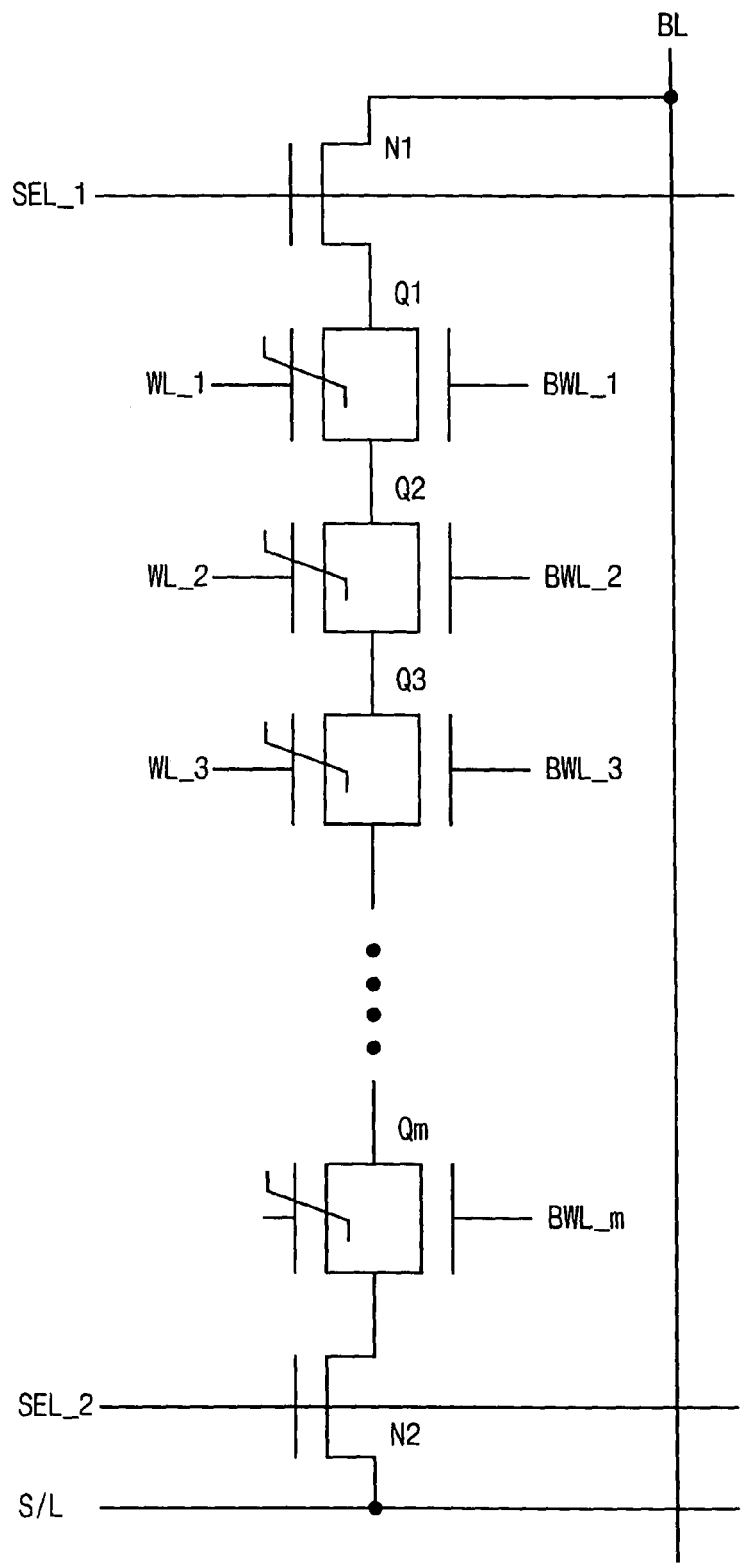
FIG. 11 is a diagram illustrating a unit array of the nonvolatile ferroelectric memory device according to an embodiment of the present invention.

FIG. 11 is a diagram illustrating a unit array of the nonvolatile ferroelectric memory device according to an embodiment of the present invention.

In the embodiment, the unit array of FIG. 11 comprises switching elements N1, N2 and a plurality of memory cells Q1~Qm. Here, the switching element N1, which is connected between the bit line BL and the memory cell Q1, has a gate to receive a selecting signal SEL_1. The switching element N2, which is connected between a sensing line S/L and the memory cell Qm, has a gate to receive a selecting signal SEL_2.

The plurality of memory cells Q1~Qm, which are connected serially between the switching elements N1 and N2, selectively perform a switching operation by word lines WL_1~WL_m and bottom word lines BWL_1~BWL_m. The detailed structure of each memory cell Q1~Qm is shown in FIG. 2b. Thus, a source of the memory cell Q1 is connected to the switching element N1, and a drain of the memory cell Qm is connected to the switching element N2.

Figure 12:
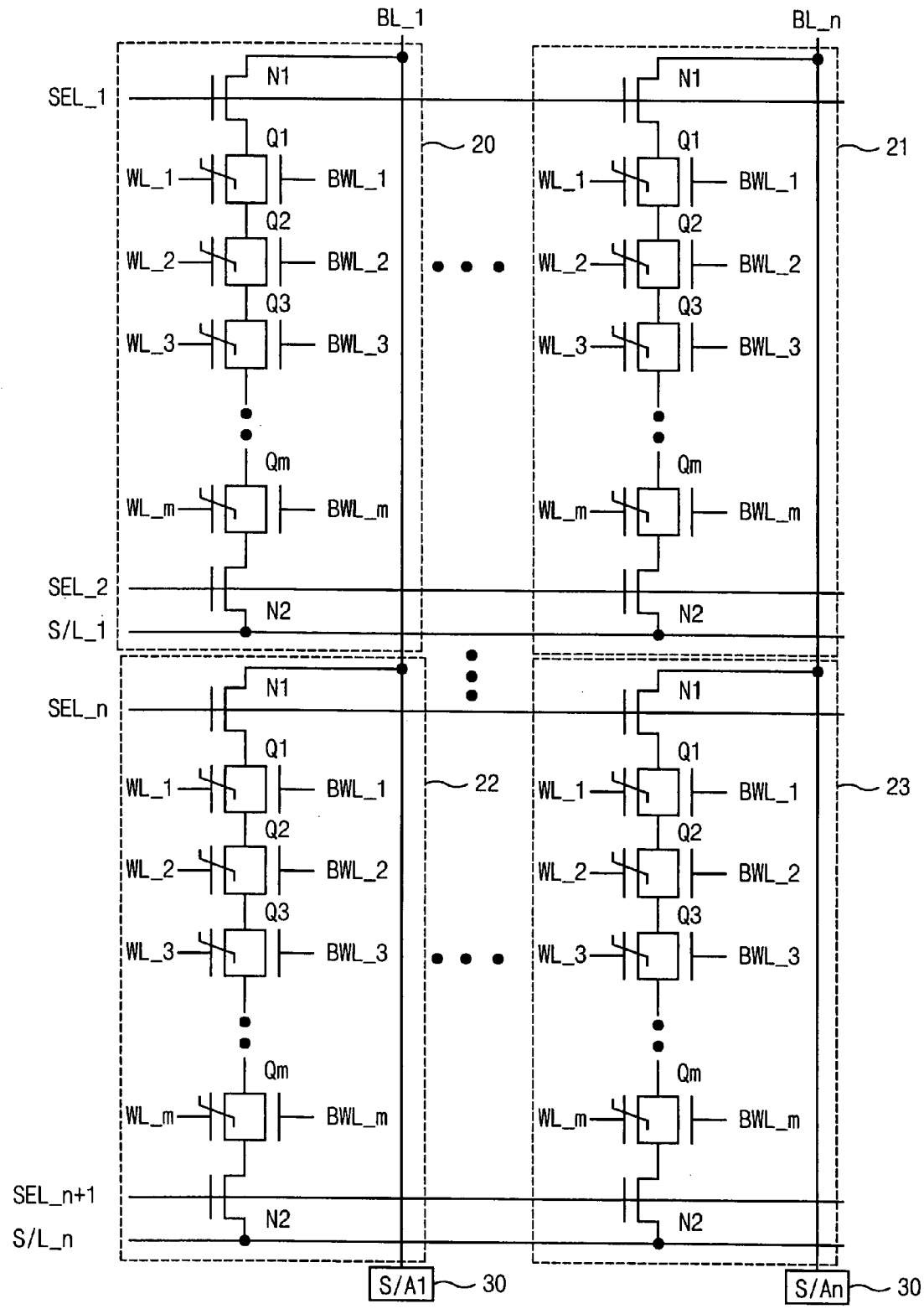
FIG. 12 is a diagram illustrating a nonvolatile ferroelectric memory device according to an embodiment of the present invention.

FIG. 12 is a diagram illustrating a nonvolatile ferroelectric memory device according to an embodiment of the present invention.

In the embodiment, a plurality of unit cell arrays 20~23 are arranged where a plurality of bit lines BL_1~BL_n and a plurality of sensing lines S/L_1~S/L_n are crossed in row and column directions. The structure of each unit cell array 20~23 is shown in FIG. 5. The plurality of bit lines BL_1~BL_n are connected one by one to a plurality of sense amplifiers 30.

Figure 13:
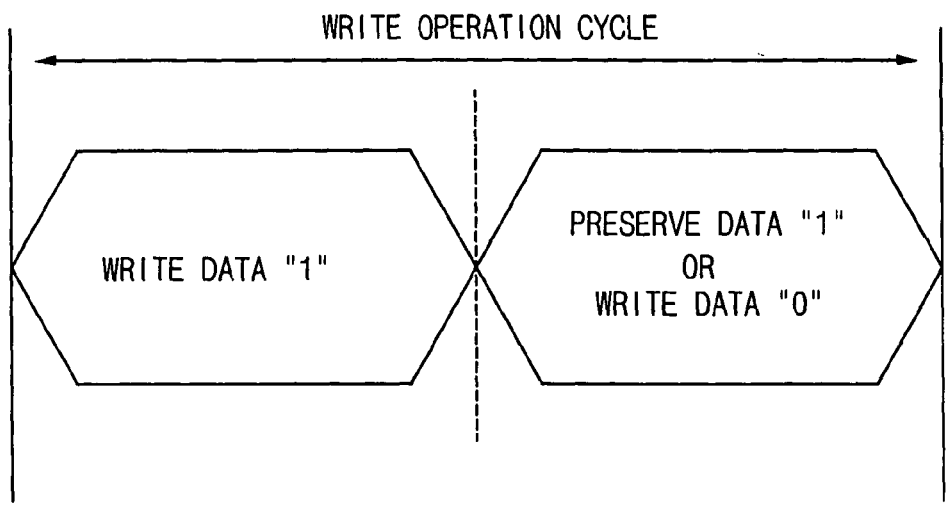
FIG. 13 is a diagram illustrating a write operation of the nonvolatile ferroelectric memory according to an embodiment of the present invention.

FIG. 13 is a diagram illustrating a write operation of the nonvolatile ferroelectric memory according to an embodiment of the present invention.

In the embodiment, a write operation cycle can be divided into two sub operation regions. That is, the data "1" is written in the first sub operation region, and the data "0" is written in the second sub operation region.

A high voltage is applied to the bit line BL in a predetermined period when the data "1" is required to be preserved. As a result, a value of the data "1" written in the first sub operation region can be preserved in the memory cell.

Figure 14:
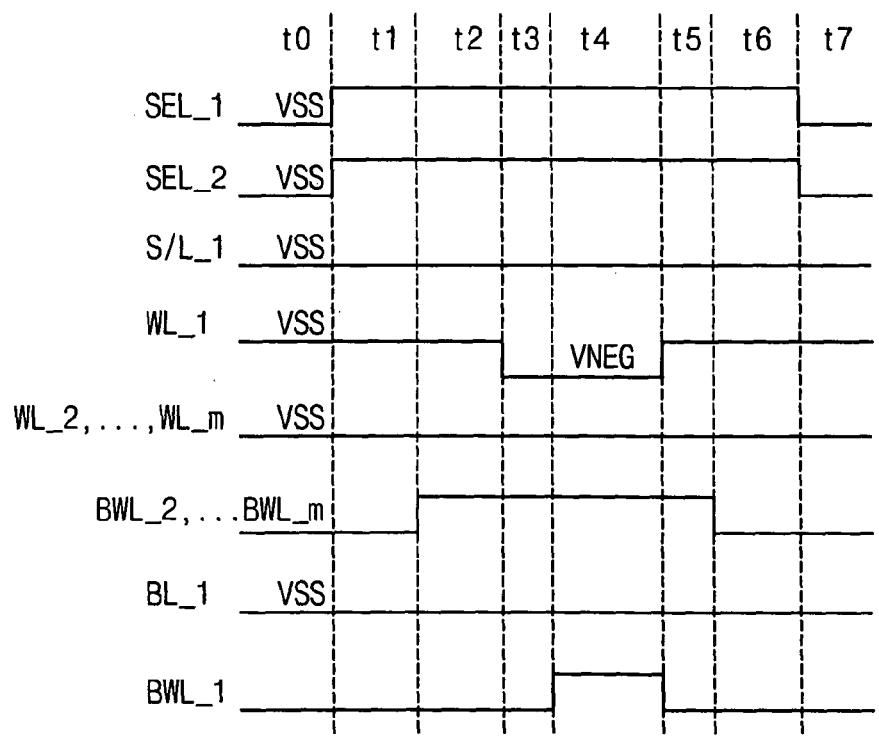
FIG. 14 is a timing diagram illustrating a write operation of high data in the nonvolatile ferroelectric memory device according to an embodiment of the present invention.

FIG. 14 is a timing diagram illustrating a write operation of high data in the nonvolatile ferroelectric memory device according to an embodiment of the present invention.

First, suppose that the memory cell Q1 shown in FIG. 5 is selected when the data "1" is written. A period t0 is defined as a precharge period of the memory cell.

In a period t1, when the selecting signals SEL_1 and SEL_2 transit to 'high', the switching elements N1 and N2 are turned on. As a result, the bit line BL is connected to a source of the memory cell Q1, and the sensing line S/L is connected to a drain of the memory cell Qm.

Here, a plurality of word lines WL_1~WL_m and a plurality of bottom word lines BWL_1~BWL_m are maintained at a low level. Then, the bit line BL_1 and the sensing line S/L_1 are maintained at a low state.

In a period t2, the rest of the bottom word lines BWL_2~BWL_m except the bottom word line BWL_1 connected to the selected memory cell Q1 transit to 'high'. As a result, the ground voltage <GND> is applied to a drain and a source of the memory cell Q1.

Next, in a period t3, a negative voltage VNEG is applied to the word line WL_1 connected to the selected memory cell Q1. In a period t4, the bottom word line BWL_1 transits to 'high'. As shown in FIG. 3a, a high voltage is applied to the ferroelectric layer 16 by voltage division of the word line WL_1 and the bottom word line BWL_1, so that the data "1" is written.

In a period t5, the word line WL_1 and the bottom word line BWL_1 are transited to the ground state, again. In a period t6, the rest of the bottom word lines BWL_2~BWL_m are transited to the ground state, so that the write operation is completed. Thereafter, in a period t7, when the selecting signals SEL_1 and SEL_2 transit to 'low', the switching elements N1 and N2 are turned off.

Figure 15:
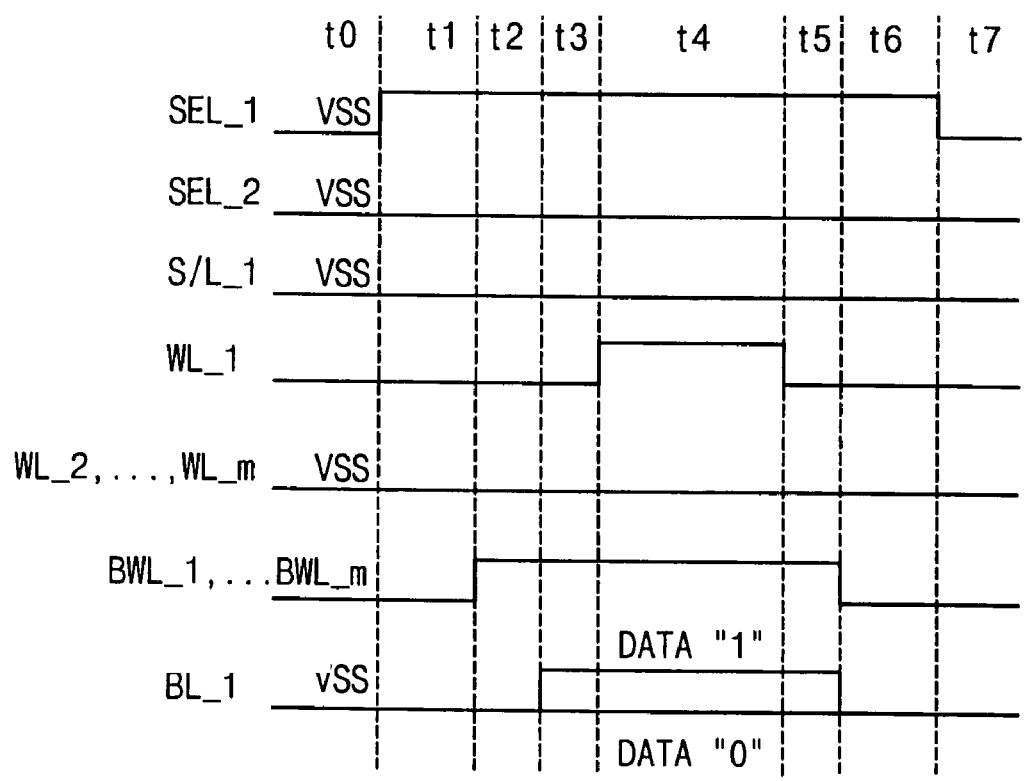
FIG. 15 is a timing diagram illustrating a write operation of low data and high data maintenance in the nonvolatile ferroelectric memory device according to an embodiment of the present invention.

FIG. 15 is a timing diagram illustrating the write operation of the data "0" and the maintenance operation of the data "1" in the nonvolatile ferroelectric memory device according to an embodiment of the present invention.

First, suppose that the memory cell Q1 shown in FIG. 5 is selected when the data "0" is written. A period t0 is defined as a precharge period of the memory cell.

In a period t1, when the selecting signal SEL_1 transits to 'high', the switching element N1 is turned on. As a result, the bit line BL is connected to the source of the memory cell Q1.

Here, the selecting signal SEL_2, the plurality of word lines WL_1~WL_m and the plurality of bottom word lines BWL_1~BWL_m are maintainted at the low state. The bit line BL_1 and the sensing line S/L_1 are maintained at the low state.

Thereafter, in a period t2, all bottom word lines BWL_1~BWL_m transit to 'high'. As a result, all of the memory cells Q1~Qm are connected to the bit line BL through the bottom word lines BWL_1~BWL_m, so that data applied to the bit line BL can be transmitted to all of the cells Q1~Qm.

In a period t3, when the data to be written in the memory cell Q1 is "0", the bit line BL_1 is continuously maintained at the ground voltage state. On the other hand, the bit line BL_1 transits to 'high' when the data "1" stored in the memory cell Q1 is required to be maintained.

In a period t4, the word line WL_1 transits to 'high'. As shown in FIG. 4a, electrons are accumulated in the P-type channel region 12 of the memory cell Q1 by the word line WL_1. Then, the positive voltage is applied to the word line WL_1, and a threshold voltage difference is generated. Thus, the polarity is formed so that channel electrons may be induced to the ferroelectric layer 16. As a result, the data "0" is written in the memory cell Q1.

When the data "1" stored in the memory cell Q1 is required to be maintained, a high voltage is applied to the bit line BL_1, so that a voltage of the bit line BL_1 is applied to the memory cell Q1. As a result, since the electrons are prevented from being formed in the channel region 12, the data "1" can be preserved.

Thereafter, in a period t5, the word line WL_1 is transited to the ground state. In a period t6, all of the bottom word lines BWL_1~BWL_m and the bit line BL_1 are transited to the ground state, so the write operation is completed. In a period t7, when the selecting signal SEL_1 transits to 'low', the switching element N1 is turned off.

Figure 16:
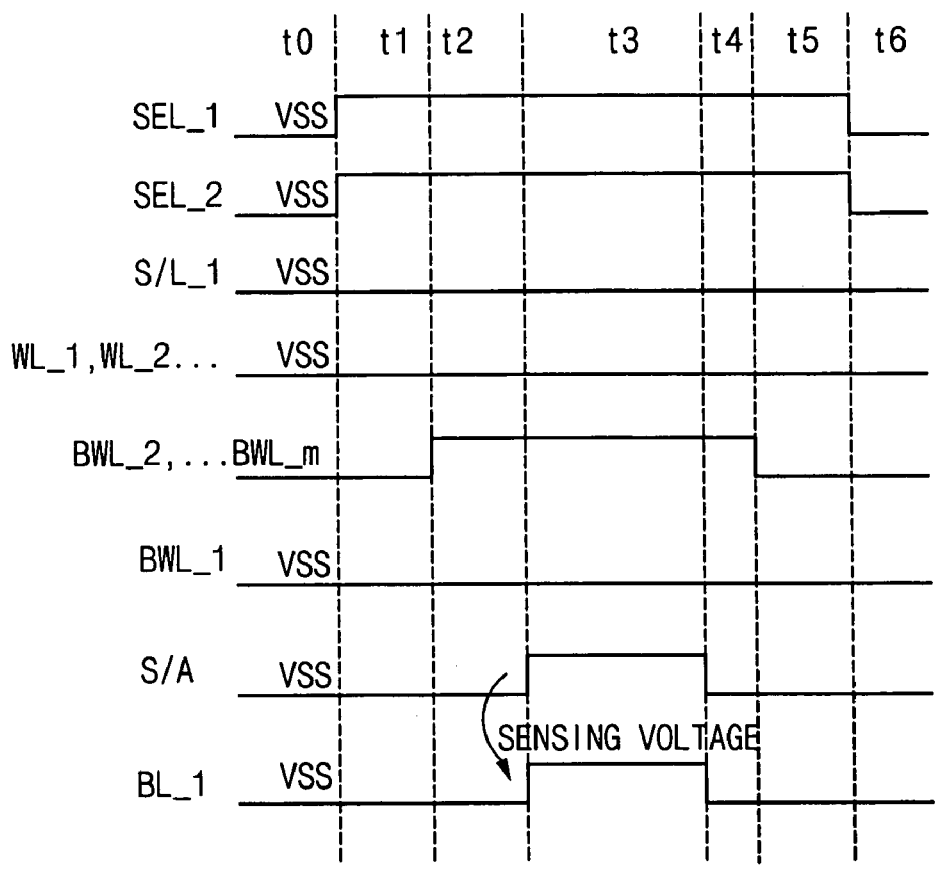
FIG. 16 is a timing diagram illustrating a sensing operation of cell data in the nonvolatile ferroelectric memory device according to an embodiment of the present invention.

FIG. 16 is a timing diagram illustrating a sensing operation of cell data in the nonvolatile ferroelectric memory device according to an embodiment of the present invention.

First, suppose that the memory cell Q1 shown in FIG. 5 is selected when the data is sensed. A period t0 is defined as a precharge period of the memory cell.

In a period t1, when the selecting signals SEL_1 and SEL_2 transit to 'high', the switching elements N1 and N2 are turned on. As a result, the bit line BL is connected to the source of the memory cell Q1, and the sensing line S/L is connected to the drain of the memory cell Qm.

Here, the plurality of word lines WL_1~WL_m and the plurality of bottom word lines BWL_1~BWL_m are maintained at the low state. The sense amplifier 30, the bit line BL_1 and the sensing line S/L_1 are maintained at the low state.

Thereafter, in a period t2, the rest of the bottom word lines BWL_2~BWL_m except the bottom word line BWL_1 connected to the selected memory cell Q1 transits to 'high'. As a result, the rest memory cells Q2~Qm except the selected memory cell Q1 are connected to the sensing line S/L_1.

Here, the plurality of word lines WL_1~WL_m are maintained all at the ground state. Thus, the flowing of current between the bit line BL_1 and the sensing line S/L is determined depending on the polarity state formed in the memory cell Q1.

In a period t3, when the sense amplifier 30 is operated so that a sensing voltage is applied to the bit line BL_1, the flowing of current of the bit line BL_1 is determined depending on the state of the memory cell Q1.

As shown in FIG. 3b, when current is not applied to the bit line BL_1, it is understood that the data "1" is stored in the memory cell Q1. On the other hand, as shown in FIG. 4b, when a current over a predetermined value is applied to the bit line BL_1, it is understood that the data "0" is stored in the memory cell Q1.

In a period t4, when the operation of the sense amplifier 30 is stopped, the bit line BL_1 transits to 'low', so that the sensing operation is completed. In a period t5, the plurality of bottom word lines BWL_2~BWL_m transit to 'low'. In a period t6, when the selecting signals SEL_1 and SEL_2 transit to 'low', the switching elements N1 and N2 are turned off.

Although the floating channel 15 comprising the N-type drain region 13, the P-type channel region 12 and the N-type source region 14 is exemplified here, the present invention is not limited but the floating channel layer 15 can comprise a P-type drain region, a P-type channel region and a P-type source region.

As described above, in an embodiment of the present invention, data of a cell are not destroyed at a read mode by using a NDRO (Non Destructive Read Out). As a result, reliability of the cell can be improved at a low voltage of a nano scale ferroelectric cell and a read operation speed can be also improved. Additionally, a plurality of ferroelectric unit cell arrays are deposited to improve integrated capacity of the cell, thereby reducing the whole size of the cell.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A nonvolatile ferroelectric memory device comprising a unit cell array which includes:
    a bottom word line;
    a plurality of insulating layers formed on the bottom word line, respectively;
    a floating channel layer comprising a plurality of P-type channel regions located on the plurality of insulating layers and a plurality of N-type drain and source regions which are alternately electrically connected in series to the plurality of P-type channel regions;
    a plurality of ferroelectric layers formed respectively on the plurality of P-type channel regions of the floating channel layer; and
    a plurality of word lines formed on the plurality of ferroelectric layers, respectively;
    wherein the unit cell array reads and writes a plurality of data by inducing different channel resistance to the plurality of P-type channel regions depending on polarity states of the plurality of ferroelectric layers.

2. A nonvolatile ferroelectric memory device comprising a unit cell array which includes:
    a bottom word line;
    a plurality of insulating layers formed on the bottom word line, respectively;
    a floating channel layer comprising a plurality of channel regions located on the plurality of insulating layers and a plurality of drain and source regions which are alternately electrically connected in series to the plurality of channel regions;
    a plurality of ferroelectric layers formed respectively on the plurality of channel regions of the floating channel layer; and
    a plurality of word lines formed on the plurality of ferroelectric layers, respectively;
    wherein the unit cell array reads and writes a plurality of data by inducing different channel resistance to the plurality of channel regions depending on polarity states of the plurality of ferroelectric layers.

3. The nonvolatile ferroelectric memory device according to claim 2, wherein the plurality of channel regions are N-type and the plurality of drain and source regions are P-type.

4. The nonvolatile ferroelectric memory device according to claim 2, wherein the plurality of channel regions are P-type and the plurality of drain and source regions are N-type.

* * * * *